(12) United States Patent
Dunn et al.

(10) Patent No.: US 7,265,018 B2
(45) Date of Patent: Sep. 4, 2007

(54) METHOD TO BUILD SELF-ALIGNED NPN IN ADVANCED BICMOS TECHNOLOGY

(75) Inventors: James S. Dunn, Jericho, VT (US); Alvin J. Joseph, Williston, VT (US); Qizhi Liu, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 311 days.

(21) Appl. No.: 10/711,486

(22) Filed: Sep. 21, 2004

(65) Prior Publication Data

US 2006/0060886 A1  Mar. 23, 2006

(51) Int. Cl.
*H01L 21/8222* (2006.01)

(52) U.S. Cl. .............. 438/312; 257/552; 257/554; 257/557

(58) Field of Classification Search ........ 438/489, 438/309, 312, 316, 318, 349; 257/552, 554, 257/557
See application file for complete search history.

(56) References Cited

U.S. PATENT DOCUMENTS

| | | | |
|---|---|---|---|
| 4,808,548 A | 2/1989 | Thomas et al. | |
| 4,985,744 A | 1/1991 | Spratt et al. | |
| 5,059,544 A * | 10/1991 | Burghartz et al. | .......... 438/341 |
| 6,399,993 B1 | 6/2002 | Ohnishi et al. | |
| 6,888,221 B1 * | 5/2005 | Joseph et al. | ............... 257/565 |
| 2002/0052074 A1 | 5/2002 | Houghton et al. | |
| 2002/0076874 A1 | 6/2002 | Coolbaugh et al. | |
| 2003/0064555 A1 | 4/2003 | Ahlgren et al. | |
| 2003/0201517 A1 | 10/2003 | Dunn et al. | |

* cited by examiner

*Primary Examiner*—Hsien-Ming Lee
*Assistant Examiner*—Su C. Kim
(74) *Attorney, Agent, or Firm*—Scully, Scott, Murphy & Presser, P.C.; William D. Sabo, Esq.

(57) ABSTRACT

The present invention provides a method of forming a self-aligned heterobipolar transistor (HBT) device in a BiCMOS technology. The method includes forming a raised extrinsic base structure by using an epitaxial growth process in which the growth rate between single crystal silicon and polycrystalline silicon is different and by using a low temperature oxidation process such as a high-pressure oxidation (HIPOX) process to form a self-aligned emitter/extrinsic base HBT structure.

18 Claims, 9 Drawing Sheets

METHOD TO BUILD SELF-ALIGNED NPN IN ADVANCED BICMOS TECHNOLOGY

FIELD OF THE INVENTION

The present invention relates to heterojunction bipolar transistors (HBTs) and more particularly to a method of forming a self-aligned HBT device for use in advanced bipolar and complementary metal oxide semiconductor (BiCMOS) technology. The method provides a self-aligned HBT having a high unity gain frequency fT that is greater than 200 GHz.

BACKGROUND OF THE INVENTION

Bipolar transistors are electronic devices with two p-n junctions that are in close proximity to each other. A typical bipolar transistor has three device regions: an emitter, a collector, and a base disposed between the emitter and the collector. Ideally, the two p-n junctions, i.e., the emitter-base and collector-base junctions, are in a single layer of semiconductor material separated by a specific distance. Modulation of the current flow in one p-n junction by changing the bias of the nearby junction is called "bipolar-transistor action."

If the emitter and collector are doped n-type and the base is doped p-type, the device is an "NPN" transistor. Alternatively, if the opposite doping configuration is used, the device is a "PNP" transistor. Because the mobility of minority carriers, i.e., electrons, in the base region of NPN transistors is higher than that of holes in the base of PNP transistors, higher-frequency operation and higher-speed performances can be obtained with NPN transistor devices. Therefore, NPN transistors comprise the majority of bipolar transistors used to build integrated circuits.

As the vertical dimensions of the bipolar transistor are scaled more and more, serious device operational limitations have been encountered. One actively studied approach to overcome these limitations is to build transistors with emitter materials whose band gaps are larger than the band gaps of the material used in the base. Such structures are called 'heterojunction' transistors.

Heterostructures comprising heterojunctions can be used for both majority carrier and minority carrier devices. Among majority carrier devices, heterojunction bipolar transistors (HBTs) in which the emitter is formed of silicon (Si) and the base of a silicon-germanium (SiGe) alloy have recently been developed. The SiGe alloy (often expressed simply as silicon-germanium) is narrower in band gap than silicon.

The advanced silicon-germanium bipolar and complementary metal oxide semiconductor (BiCMOS) technology uses a SiGe base in the heterojunction bipolar transistor. In the high-frequency (such as multi-GHz) regime, conventional compound semiconductors such as GaAs and InP currently dominate the market for high-speed wired and wireless communications. SiGe BiCMOS promises not only a comparable performance to GaAs in devices such as power amplifiers, but also a substantial cost reduction due to the integration of heterojunction bipolar transistors with standard CMOS, yielding the so-called "system on a chip."

State-of-the-art NPN HBTs require a high unity current gain frequency fT and a high unity unilateral power gain frequency fmax. Base resistance, Rb, is an important factor that must be lowered in order to obtain a high-performance, e.g., high fT and fmax, HBT.

One solution for providing high performance HBTs is to build the HBT on a structure that includes a raised extrinsic base. The raised extrinsic base is formed by depositing an extra layer of polycrystalline silicon (or SiGe) atop a conventional SiGe extrinsic region.

In prior art process for forming HBTs containing raised extrinsic bases, elaborate and complicate processing steps are used to integrate a self-aligned raised extrinsic base into an advanced BiCMOS process. Thus, there is a need for providing a method that can easily integrate a self-aligned raised extrinsic base HBT into advanced BiCMOS processing.

SUMMARY OF THE INVENTION

The present invention provides a method of forming a self-aligned heterobipolar transistor (HBT) device using BiCMOS technology. The method of the present invention is capable of forming NPN or PNP HBTs, with NPN HBTs being highly preferred. The method includes forming a raised extrinsic base structure by using an epitaxial growth process in which the growth rate between single crystal silicon and polycrystalline silicon is different and by using a low temperature oxidation process to form a self-aligned emitter/extrinsic base HBT structure. By low temperature oxidation, it is meant an oxidation temperature of about 700° C. or less.

In broad terms, the method of the present invention comprises the steps of:

forming a pedestal atop a structure that comprising at least a base layer located on a surface of a substrate having a collector and trench isolation regions located therein, wherein said base layer is monocrystalline over the collector and polycrystalline over the trench isolation regions;

forming an extra base layer over said structure including said pedestal, wherein said extra base layer comprises monocrystalline material over the substrate and polycrystalline material over the pedestal and said base layer that is polycrystalline, said polycrystalline material over said pedestal is thinner than the polycrystalline material over said base layer that is polycrystalline;

converting at least said polycrystalline material over said pedestal of said extra base layer into an oxide utilizing a low temperature oxidation process;

removing said oxide and said pedestal from said structure to provide an emitter opening; and forming at least a polysilicon emitter in said emitter opening.

In one embodiment of the present invention, the pedestal is an oxide pedestal. In this embodiment of the present invention, the low temperature process converts the polycrystalline material of the extra base layer atop the oxide pedestal into an oxide. During the subsequent removal process, the oxide produced by the low-temperature oxidation step and the oxide pedestal are removed in a single etching step. After removal of oxide, a second low temperature oxidation step is performed to provide at least an oxide layer within the emitter opening. A nitride spacer is then formed on each sidewall of the emitter opening and a chemical oxide removal (COR) process is employed to remove the oxide layer from the bottom of the emitter opening prior to forming the polysilicon emitter.

In one preferred embodiment of the present invention, the low temperature oxidation process is a high-pressure oxidation (HIPOX) process, which will be defined in greater detail herein below.

In another embodiment of the present invention, a nitride pedestal is employed. In accordance with this embodiment of the present invention, the nitride pedestal is formed on an oxide base layer. The oxide base layer is formed by a low temperature process. In this embodiment of the present invention, the oxide layer formed in the converting step is removed stopping atop the nitride pedestal. Another low temperature oxidation process is then employed to provide an oxide layer outside the emitter opening and then the nitride pedestal is removed from the structure exposing the oxide base layer. Nitride spacers are formed in the emitter opening and thereafter the oxide base layer is removed using a COR process. After the COR process, the polysilicon emitter is formed.

BRIEF DESCRIPTION OF THE DRAWINGS

FIGS. 2A-2I are pictorial representations (through cross sectional views) illustrating the basic processing steps employed in a second embodiment of the present invention.

DETAILED DESCRIPTION OF THE INVENTION

Figure 1A:
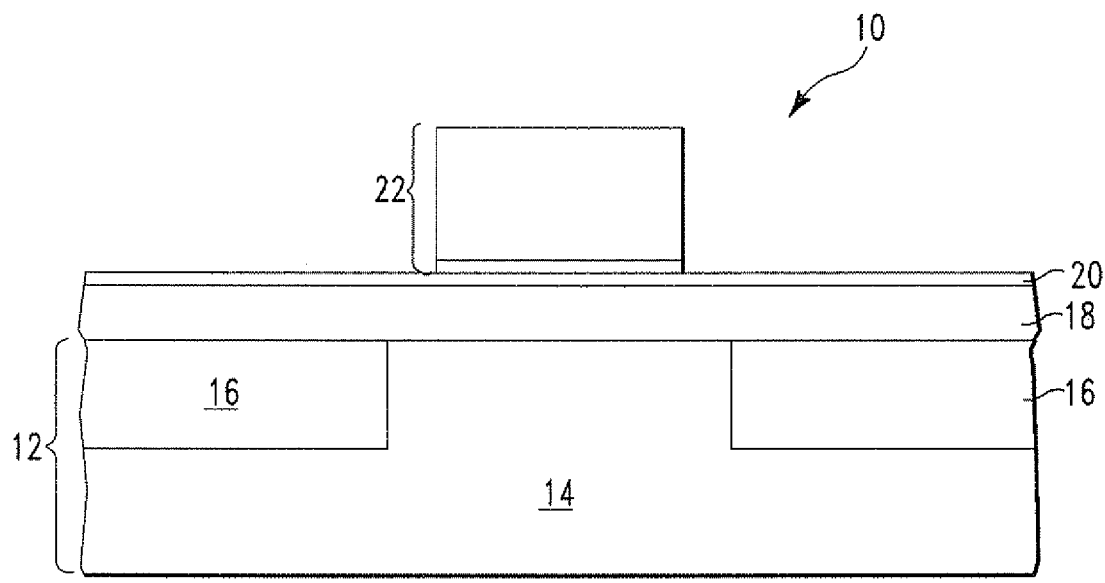
FIGS. 1A-1H are pictorial representations (through cross sectional views) illustrating the basic processing steps employed in a first embodiment of the present invention.

The present invention, which provides a method to build self-aligned HBT devices in advanced BiCMOS technology, will now be described in greater detail by referring to the drawings that accompany the present application. It is noted that the drawings are provided for illustrative purposes and are thus not drawn to scale. Moreover, in the drawings, like and corresponding elements are referred to by like reference numerals.

The drawings of the present application are directed to the HBT device area only. For clarity, the CMOS device area as well as the other areas of a typically BiCMOS structure are not shown in the drawings of the present application. The other areas including the CMOS device area lay to the periphery of the HBT device area shown. Also, despite showing the presence of a single HBT device area, the present invention also can be employed in fabricating HBT devices in a plurality of HBT device areas. The CMOS device areas can be formed before or after completion of the HBT device. In fabricating devices in the other areas, the HBT device area typically is protected using one or more protective films during the fabrication of the other devices.

Reference is first made to FIGS. 1A-1H, which illustrate the various processing that are employed in the first embodiment of the present invention. In the first embodiment of the present invention, an oxide pedestal is used in defining the emitter pedestal of the HBT device. The process of the first embodiment of the present invention begins with providing the structure 10 shown in FIG. 1A. Specifically, the structure 10 shown in FIG. 1A comprises a substrate 12 having a collector 14 and trench isolation regions 16 located therein. The structure 10 also includes a base layer 18 located on a surface of substrate 12 including the trench isolation regions 16, a Si-containing cap layer 20, which is optional, atop the base layer 18, and an oxide pedestal 22 located on a portion of the Si-containing layer 20, if present, or the base layer 18 which includes the collector 14 therebeneath.

The substrate 12 shown in FIG. 1A comprises any Si-containing semiconductor material including, for example, Si, SiGe, SiC, SiGeC, as well as layered semiconductor materials such as a silicon-on-insulator (SOI) substrate or a silicon germanium-on-insulator (SGOI) substrate. Alternatively, the substrate 12 may be comprised of a Si layer such as epitaxial Si or amorphous Si located atop a semiconductor substrate. The substrate 12 may include various doping and well regions (not shown). The substrate 12 also includes an adjacent subcollector (not shown).

The trench isolation regions 16 are fabricated into substrate 12 using techniques that are well known to those skilled in the art. For example, the trench isolation regions 16 are typically formed by lithography, etching, optionally forming a trench liner, trench fill and planarization. The trench fill includes a trench dielectric material such as a high-density oxide or tetraethylorthosilicate (TEOS). Although the depth of the trench isolation regions 16 may vary, they typically have a depth that is about 1 micron or less, i.e., shallow trench isolation (STI) regions.

Base layer 18 is then formed atop the entire surface of substrate 12, including the collector 14 and the trench isolation regions 16. The base layer 18 is formed by a low temperature epitaxial growth process in which the temperature during epitaxy is typically in the range from about 450° C. to about 700° C. The base layer, which may comprise Si, SiGe or a combination of Si and SiGe is monocrystalline on top of the exposed portions of substrate 12, including the area containing collector 14, and polycrystalline on top of the trench isolation regions 16. The difference in crystallinity in base layer 18 is not shown in the drawings for clarity. The region in which polycrystalline changes over to monocrystalline is referred to in the art as the facet region.

The base layer 18 formed at this step of the present invention typically has a thickness, after epitaxial growth, from about 20 nm to about 400 nm. Because of the epitaxial process, the base layer 18 is thicker atop the exposed portions of substrate 12 as compared to atop the trench isolation regions 16. The difference in thickness in base layer 18 is not shown in the drawings.

Next, an optional Si-containing cap layer 20 is formed atop the base layer 18. The optional Si-containing cap layer 20 may be comprised of Si, SiGe or a combination thereof. The optional Si-containing cap layer 20 is formed by epitaxy as well. The optional Si-containing layer 20 can be formed in the same reactor chamber as the base layer 18, without breaking vacuum. When present, the optional Si-containing cap layer 20 has a thickness that is typically from about 1 nm to about 50 nm.

An oxide layer is then formed atop either the optional Si-containing cap layer 20, if present, or the base layer 18 by either oxidation or a deposition process such as, for example, chemical vapor deposition (CVD), plasma enhanced chemical vapor deposition (PECVD), evaporation, chemical solution deposition, atomic layer deposition (ALD) and the like. The oxide layer typically has a thickness after deposition from about 2 nm to about 60 nm.

The oxide layer is then patterned via lithography and etching providing an oxide pedestal 22 on the structure. The lithography step includes applying a photoresist to the blanket oxide layer, exposing the photoresist to a pattern of radiation and developing the exposed photoresist using a conventional resist developer. The etching step used in defining the oxide pedestal 22 includes a wet etch or a dry etch process that selectively removes oxide as compared to Si or SiGe. The oxide pedestal 22 is employed in the present invention in defining the area in which the emitter pedestal will be subsequently formed.

Figure 1B:
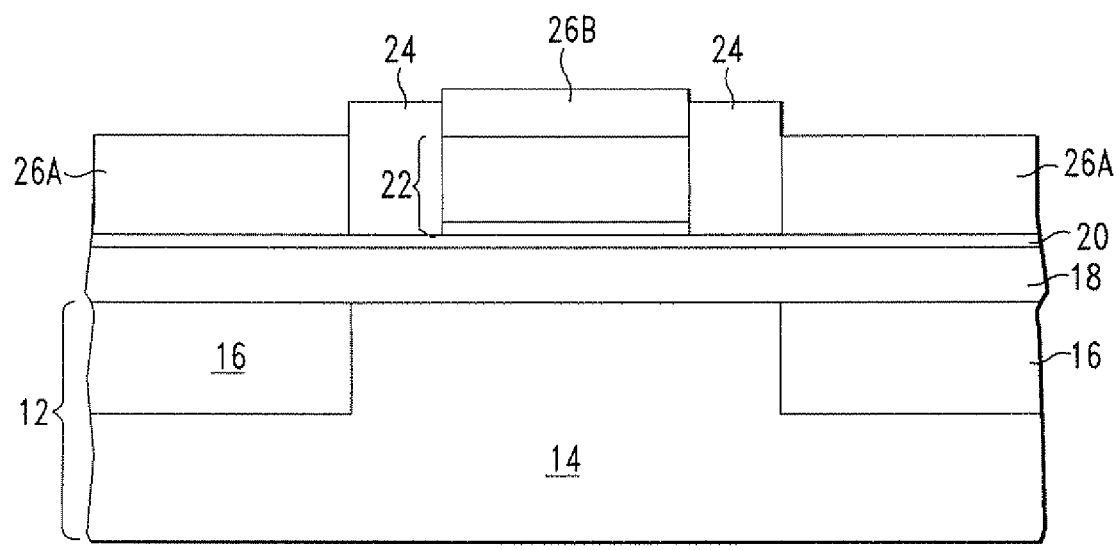

Another layer of base material is then formed over the entire the structure 10 shown in FIG. 1A providing the structure shown, for example, in FIG. 1B. The extra base layer, which includes the same or different material as base layer 18, is formed using the low temperature epitaxy process mentioned above. As indicated previously with base layer 18, the extra base layer formed atop oxide, e.g., oxide pedestal 22, has a thickness that is less than the extra base layer formed atop a Si-containing material due to the slower growth rate of Si or SiGe on oxide.

In the structure shown in FIG. 1B, the extra base layer is monocrystalline over the substrate 12 and polycrystalline over the trench isolation regions 16 and the oxide pedestal 22. In the drawing, reference numeral 24 denotes the monocrystalline region of the extra base layer and reference numerals 26A and 26B denote the polycrystalline regions of the extra base layer over the trench isolation regions 16 and the oxide pedestal 22, respectively. Note that the polycrystalline region 26B located on the oxide pedestal 22 is much thinner than the polycrystalline region 26A located atop the trench isolation regions 16.

Figure 1C:
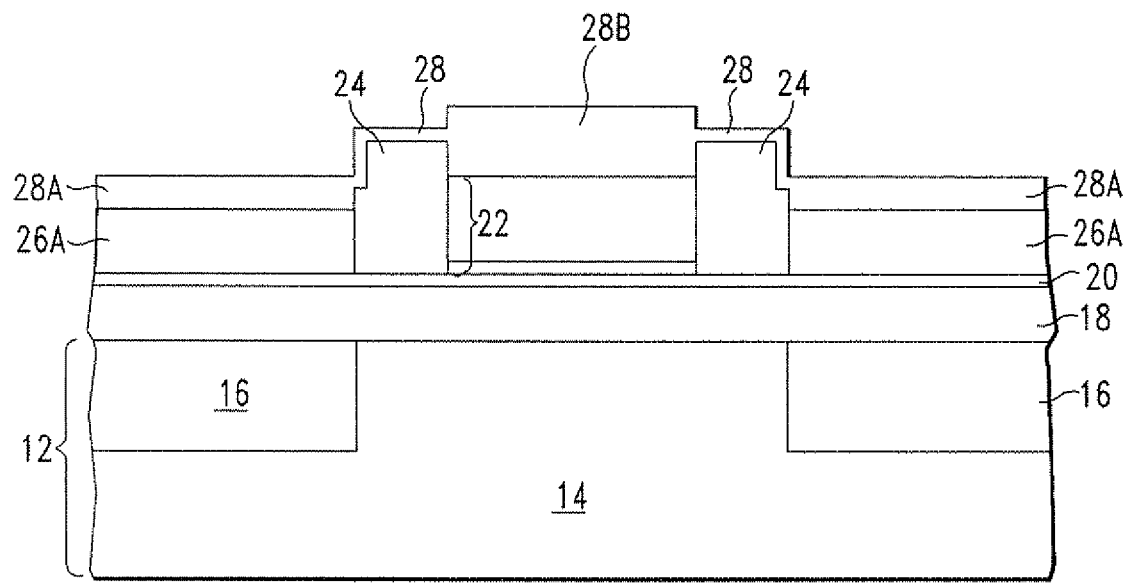

The polycrystalline regions 26A and 26B are then subjected to a first low temperature oxidation process which is capable of converting polycrystalline Si and/or SiGe into an oxide. FIG. 1C shows the structure after the first low temperature oxidation process has been performed. As shown in FIG. 1C, and because of the difference in thickness of the previously formed polycrystalline regions 26A and 26B, the polycrystalline region 26B atop the oxide pedestal 22 is completely converted into oxide region 28B, while only a portion of polycrystalline region 26A atop the trench isolation regions 16 is converted into oxide region 28A. Note that oxide, 28, is also formed atop portions of the monocrystalline region 24 as well.

The low temperature oxidation process is performed at a temperature of about 700° C. or less. More typically, the low temperature oxidation process is performed 500° C. to about 700° C. The low temperature oxidation process can be performed utilizing any oxidation process that is capable of operation at the above temperature range. For example, the oxidation may include, in one preferred low temperature oxidation process is a high pressure oxidation (HIPOX) process.

The HIPOX process used in the present invention is typically performed at a pressure that is typically greater than about 1 atmosphere. The HIPOX as well as the other low temperature oxidation processes are performed in the presence of an oxygen-containing ambient including, for example, air, ozone, steam or a combination thereof. The oxygen-containing ambient can be admixed, i.e., diluted, with an inert gas such as He, Ar, Ne, Xe, Kr, and mixtures thereof. The oxidation step can be performed for various periods of time that can be preselected prior to performing the step.

Figure 1D:
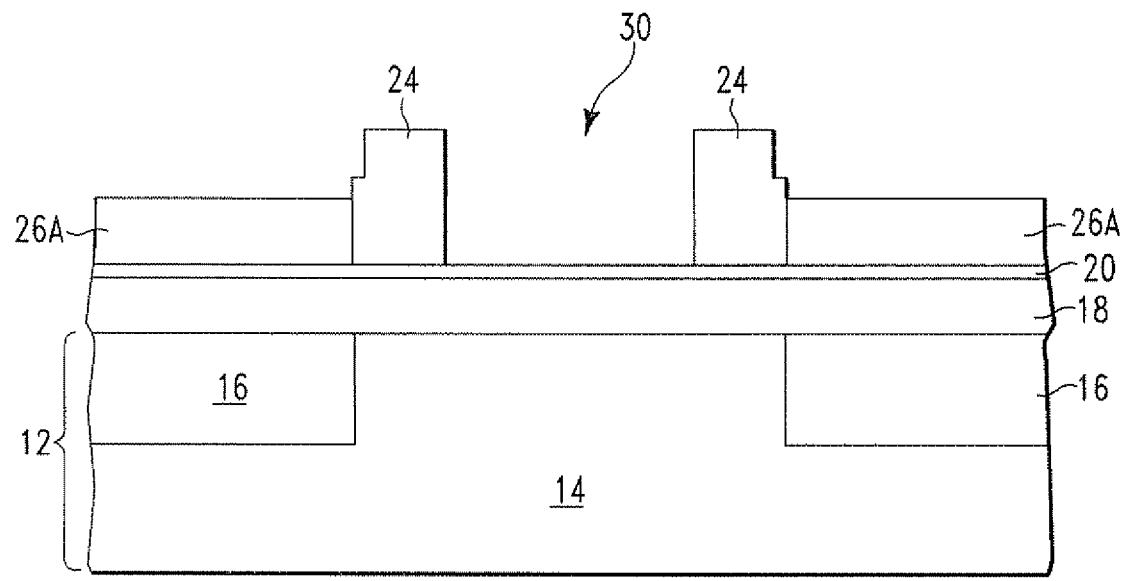
Figure 1E:
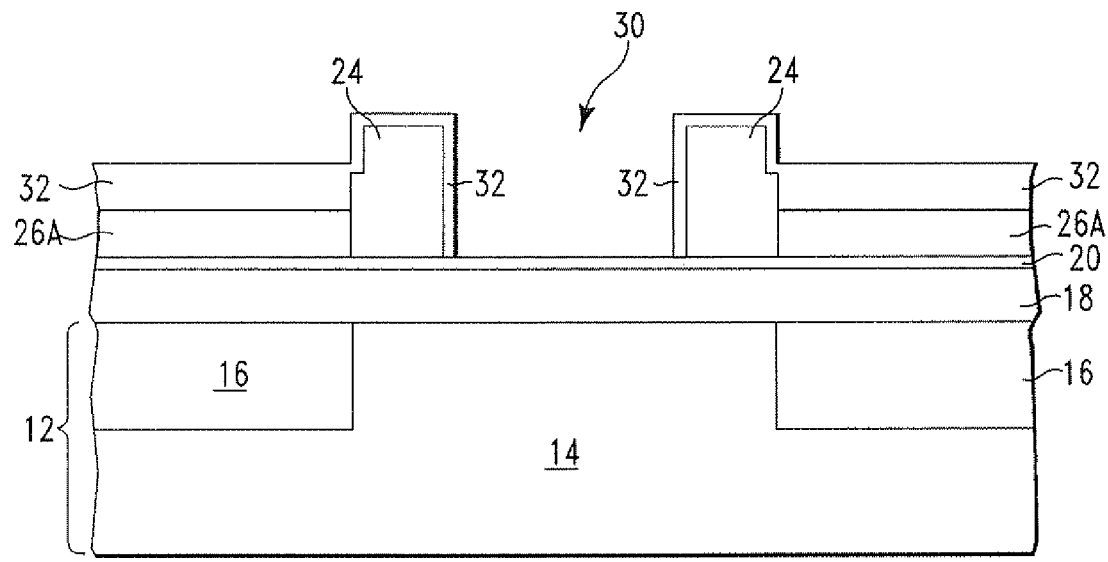

An etching process that selectively removes oxide is then performed on the structure shown in FIG. 1C providing the structure shown in FIG. 1D. Specifically, the etching process may include a wet etch or a dry etch, with a wet etch being more preferred. The wet etch includes a chemical etchant such as HF that selectively removes oxide stopping on Si or SiGe. As shown, in the drawing, all Si-containing surfaces, i.e., remaining polycrystalline region 26A, monocrystalline material 24, and optional Si-containing cap 20 or base layer 18, are exposed after removing the oxide from the structure. The removal of the oxide 28 and 22 provides an emitter opening 30 in the structure.

After performing the etching step mentioned above, a second low temperature oxidation process is performed which is capable of forming oxide layer 32 over the entire structure. The second low temperature oxidation process is performed utilizing the conditions described above for the first low temperature oxidation process. Note that the oxide 32 within the emitter opening 30 is thinner as compared to oxide 32 outside the emitter opening 30 due to slower oxidation rate within the emitter opening 30. The structure including oxide 32 is shown, for example, in FIG. 1E.

Nitride spacers 34 are then formed on the exposed inner sidewalls of the emitter opening 30 utilizing a conventional deposition such as CVD, or PECVD, and etching. The etching process typically comprises a dry etch such as, for example, reactive ion etching. The structure including the nitride spacers 34 is shown, for example, in FIG. 1F.

Figure 1F:
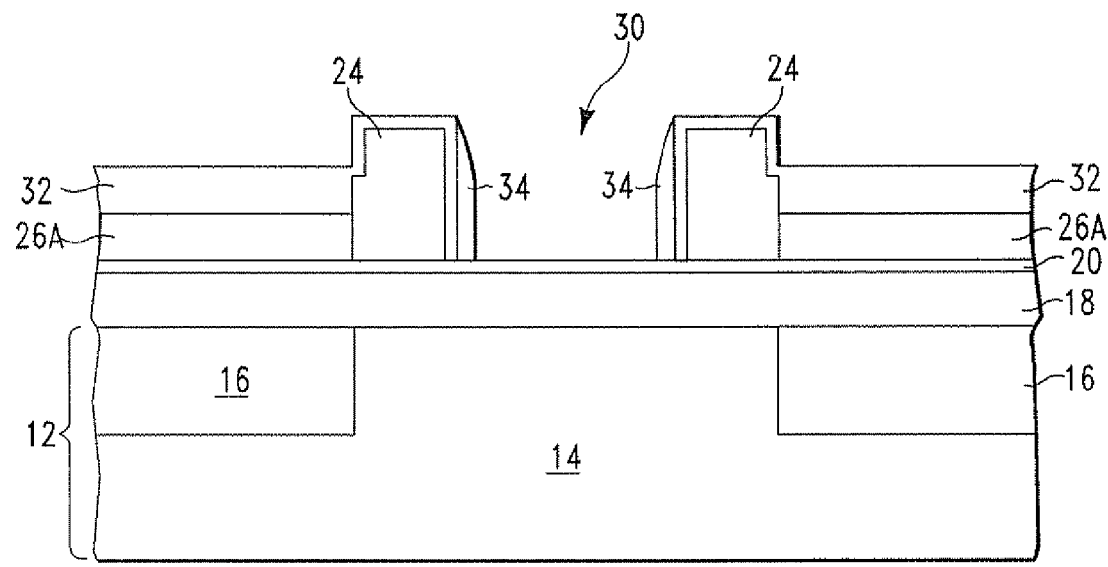
Figure 1G:
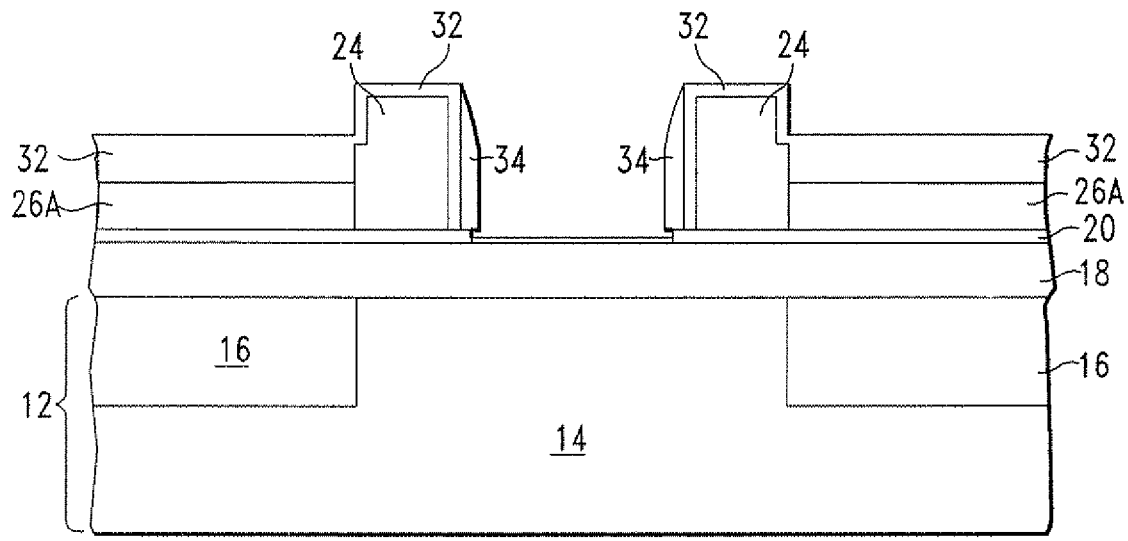

Next, the structure shown in FIG. 1F is subjected to a chemical oxide removal (COR) process that removes exposed oxide 32 from inside the emitter opening 30 exposing the optional Si-containing cap 20 or the base layer 18. The COR process utilizes a vapor or, more preferably, a plasma of HF and $NH_3$. The COR process is performed at low pressures (of about 6 millitorr or below). Note that during the COR process, minimal lateral etching may occur. If such lateral etching does occur, oxide from beneath nitride spacers 34 would be removed. The resultant structure formed after the COR process has been performed is shown, for example, in FIG. 1G. The COR process may somewhat thin the underlying optional Si-containing cap layer 20 or the base layer 18.

Figure 1H:
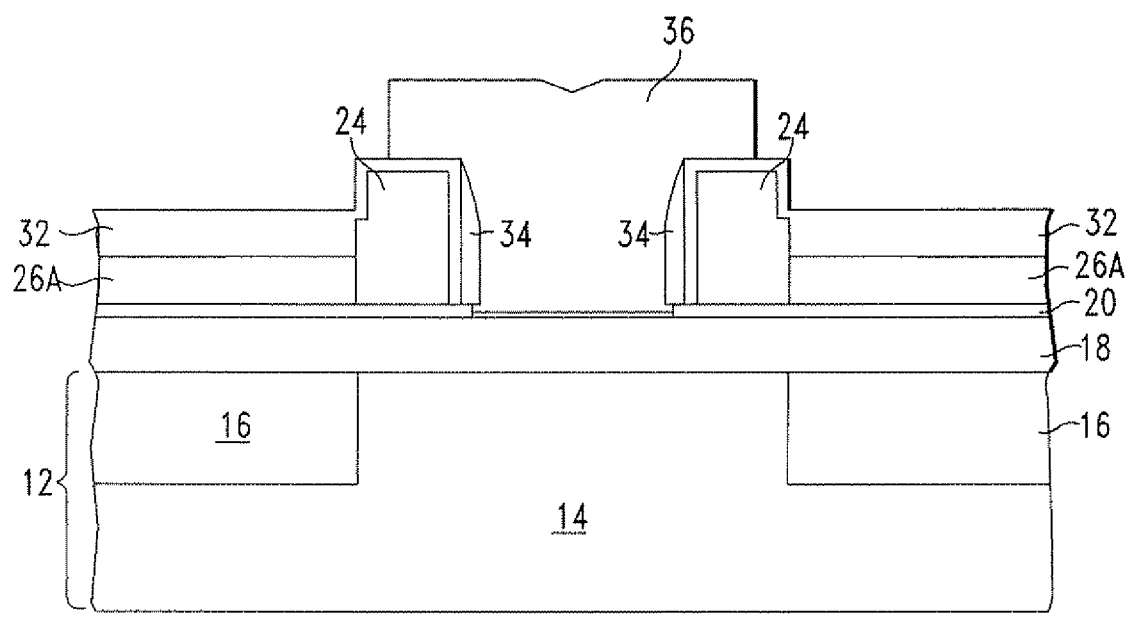

After performing the COR process, a polysilicon emitter 36 is formed over the exposed Si-containing cap 20 or base layer 18 that is within the emitter opening 30. The resultant structure including the polysilicon emitter 36 is shown in FIG. 1H. As shown, the polysilicon emitter 36 extends above the emitter opening 30 such that a portion thereof is located atop monocrystalline region 24.

The polysilicon emitter 36 is formed by first depositing a blanket layer of polysilicon. The blanket polysilicon layer can be doped during deposition thereof using a conventional in-situ deposition process, or it can be doped after deposition by ion implantation. Following deposition of the blanket layer of polysilicon, the blanket layer is patterned via lithography and etching to provide the polysilicon emitter 36.

Following polysilicon emitter formation, conventional BiCMOS processing can be employed to complete HBT device formation. It should be noted that depending on the doping type of the emitter, base and collector, the HBT device shown in FIG. 1H can either by a NPN or a PNP HBT, with a NPN HBT being highly preferred. The structure shown in FIG. 1H is a self-aligned emitter (36)/raised extrinsic base (i.e., layer 26A) bipolar structure. By self-aligned, it is meant that the distance between the emitter and extrinsic base is not limited or determined by photolithography.

Reference is now made to FIGS. 2A-2I which illustrate the processing flow of the second embodiment of the present invention. In the second embodiment of the present invention a nitride pedestal is used in place of the oxide pedestal of the first embodiment of the present invention.

Figure 2A:
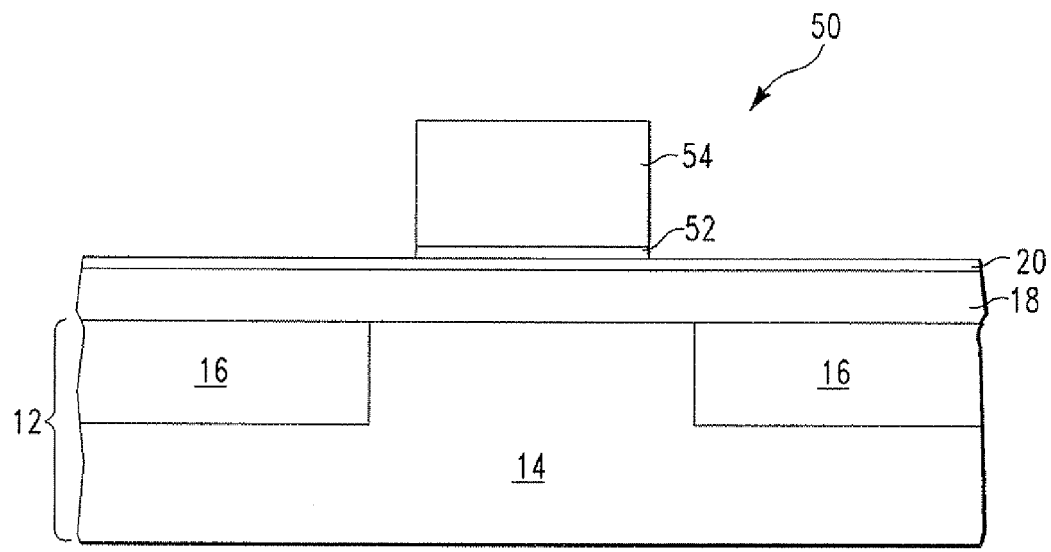

Reference is made to the structure 50 shown in FIG. 2A. This structure is similar to the structure 10 of FIG. 1A except that the oxide pedestal 22 is replaced by a nitride pedestal 54, which is formed on an oxide base 52. Since elements 12, 14, 16, 18, and 20 are the same as discussed above in connection with the first embodiment of the present invention, no further details concerning those elements or the process of forming the same are needed herein. Thus, after forming the base layer 18 or optional Si-containing cap layer 20, an oxide base 52 is formed by a low temperature oxidation process or by a conventional deposition process. The oxide base formed by this low temperature oxidation process is a thin layer whose thickness is typically from about 2 nm to about 60 nm.

After oxidation, a nitride layer is formed atop the oxide base layer by a conventional deposition process such, for example, CVD, PECVD, evaporation, chemical solution deposition, atomic layer deposition and the like. The nitride layer formed atop the thin oxide base layer has a thickness that is typically from about 10 nm to about 100 nm. The oxide base layer and the nitride layer are then patterned via lithography and etching providing the structure shown in FIG. 2A. As shown, a patterned oxide base 52 and a pedestal nitride 54 are formed. The stack of oxide 52/nitride 54 defines the emitter pedestal area of the HBT device.

Figure 2B:
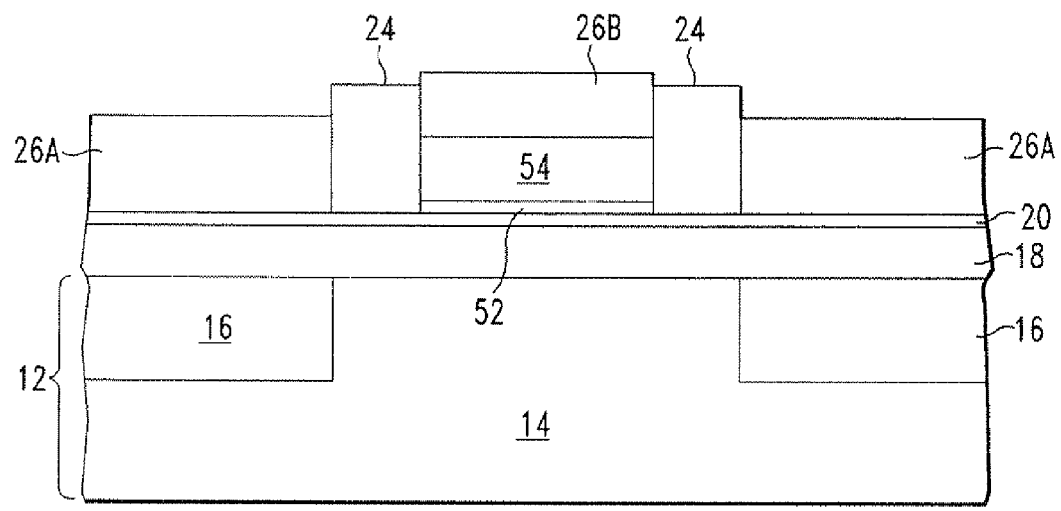
Figure 2C:
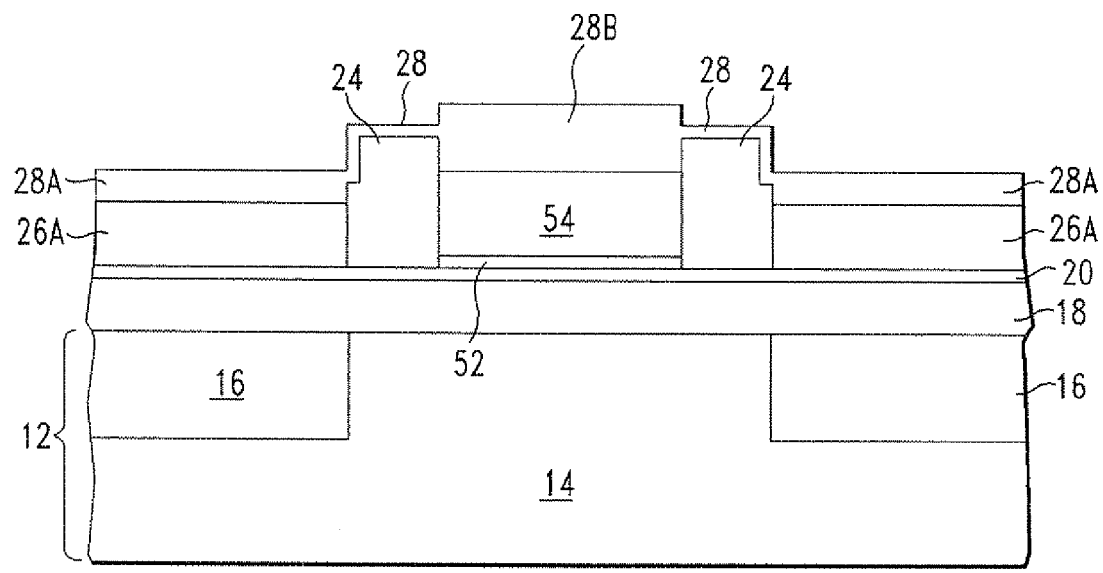

Next, and as shown in FIG. 2B, an extra base layer is formed atop the structure shown in FIG. 2A providing polycrystalline regions 26A and 26B and monocrystalline region 24. The polycrystalline material 26B formed atop the nitride pedestal 54 is thinner than the polycrystalline material 26A atop the trench isolation regions due to the slower growth rate of Si or SiGe on nitride.

After forming the extra base layer including regions 26A, 26B and 24, the structure shown in FIG. 2B is subjected to a second low temperature oxidation process that converts polycrystalline material into oxide. The resultant structure that is formed after this second low temperature process has been performed in shown in FIG. 2C. This second low temperature oxidation process used in this embodiment of the present includes the conditions used in the first low temperature oxidation process of the first embodiment of the present invention. As in the first embodiment, the oxidation provides oxide 28, 28A and 28B. The oxide 28B is formed atop the nitride pedestal 54, oxide 28 is formed atop monocrystalline region 24 and oxide 28A is formed atop polycrystalline region 26A.

Figure 2D:
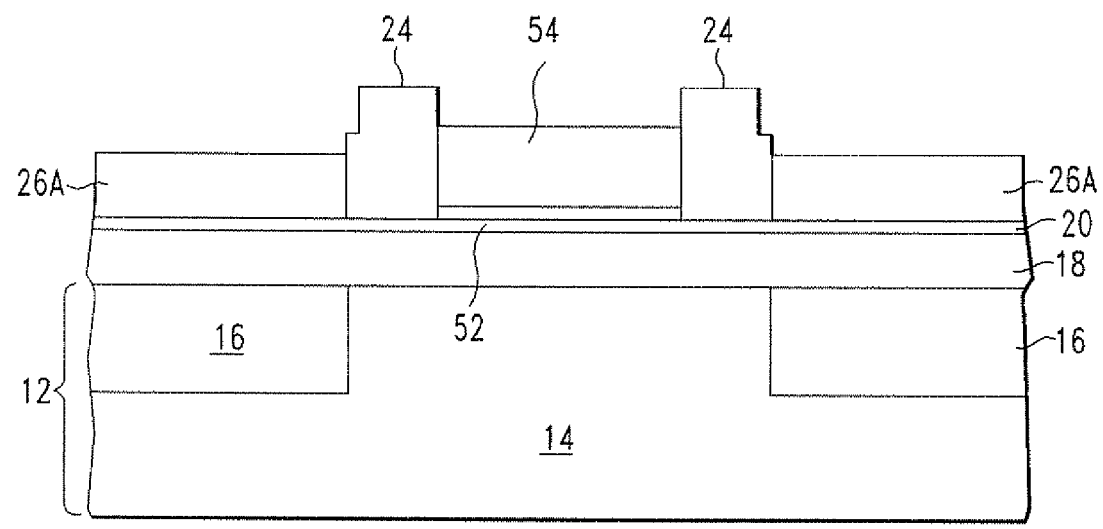
Figure 2E:
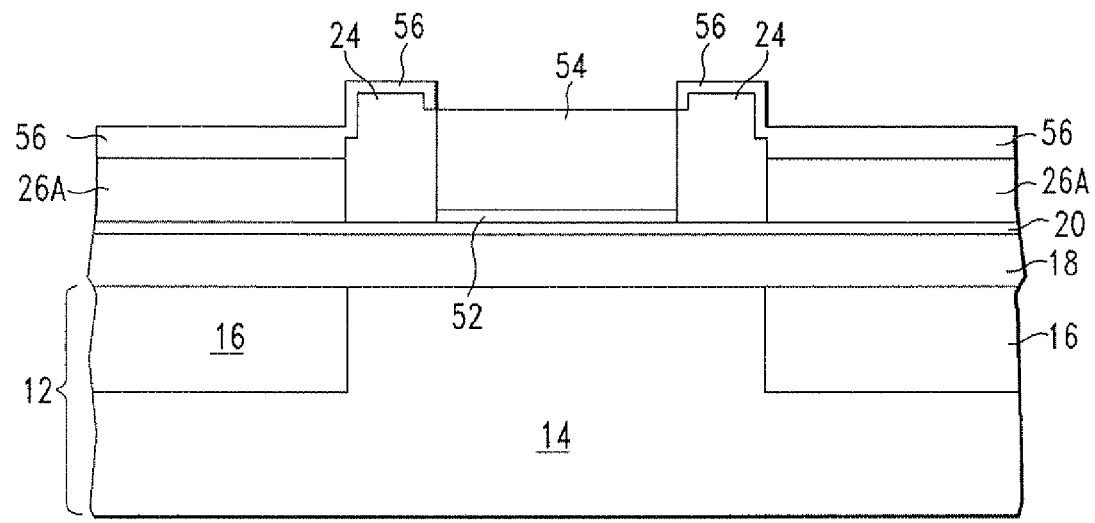

The exposed oxide, i.e., oxide 28B, 28 and 28A, is then removed from the structure utilizing an etching process that selectively removes oxide as compared to Si or SiGe. The etching process used in this embodiment of the present invention is the same as that used in the first embodiment for removing oxide from the structure. The resultant structure that is formed after oxide removal is shown in FIG. 2D. Unlike the first embodiment of the present invention, nitride pedestal 54 is not removed from the structure at this point of the present invention.

Next, another low temperature oxidation process is performed forming oxide layer 56 on the exposed polycrystalline 26A and monocrystalline 24 surfaces. The oxide layer 56 formed at this point of the present is thinner than the oxide layer 52. Typically, oxide layer 56 has a thickness from about 20 nm to about 100 nm. This oxidation step is also performed using the conditions described above. The resultant structure including oxide layer 56 is shown, for example, in FIG. 2E. Note that no oxide layer 56 forms atop the nitride pedestal 54.

Figure 2F:
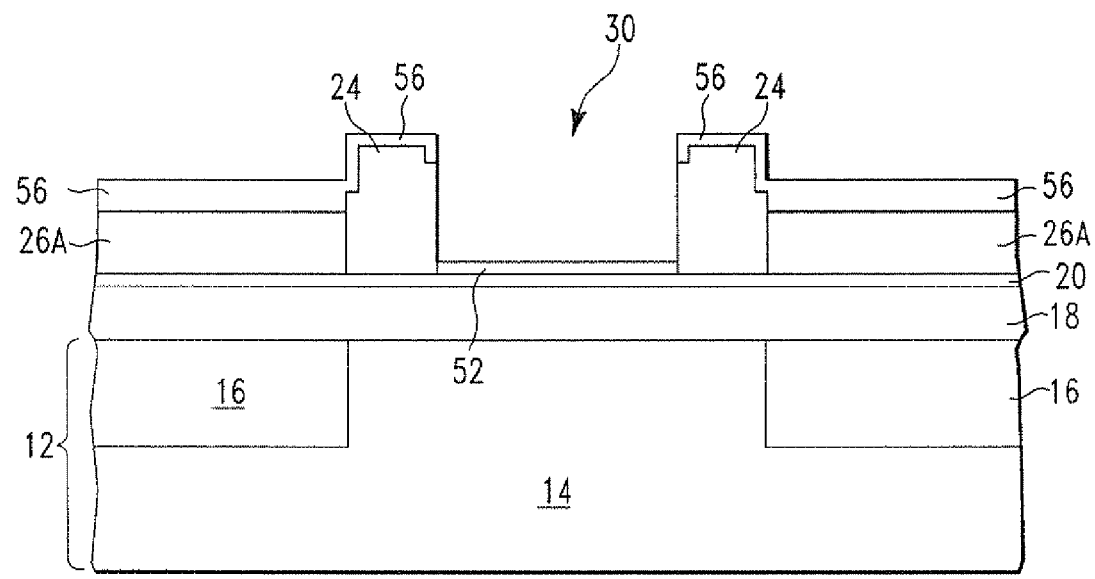
Figure 2G:
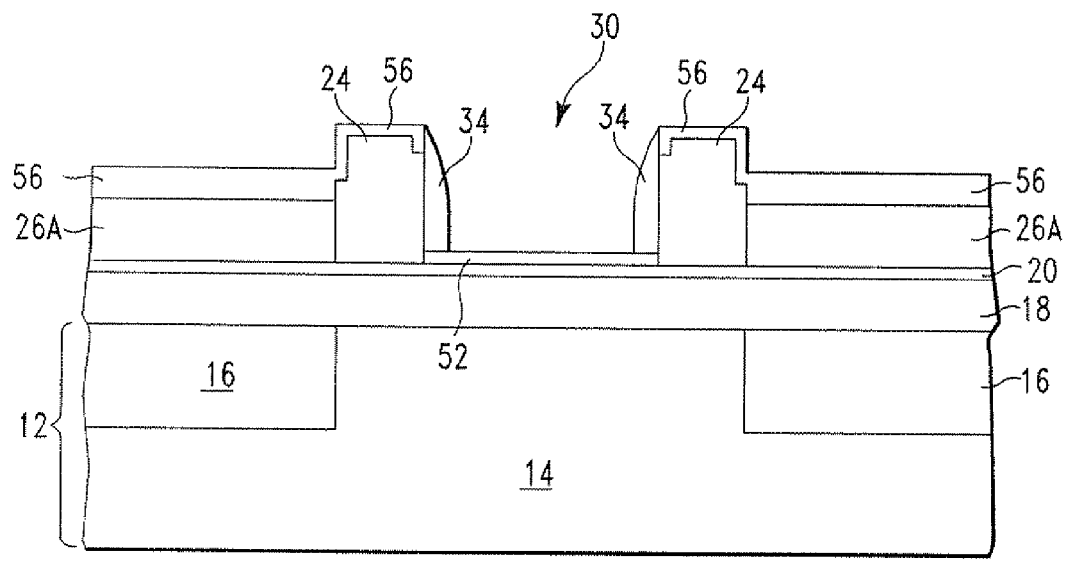
Figure 2H:
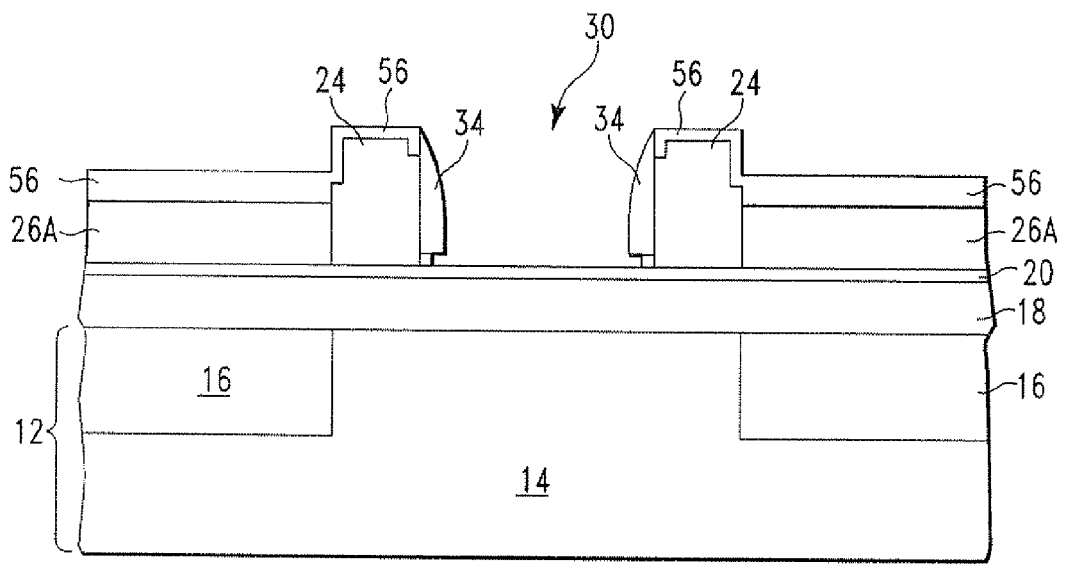
Figure 21:
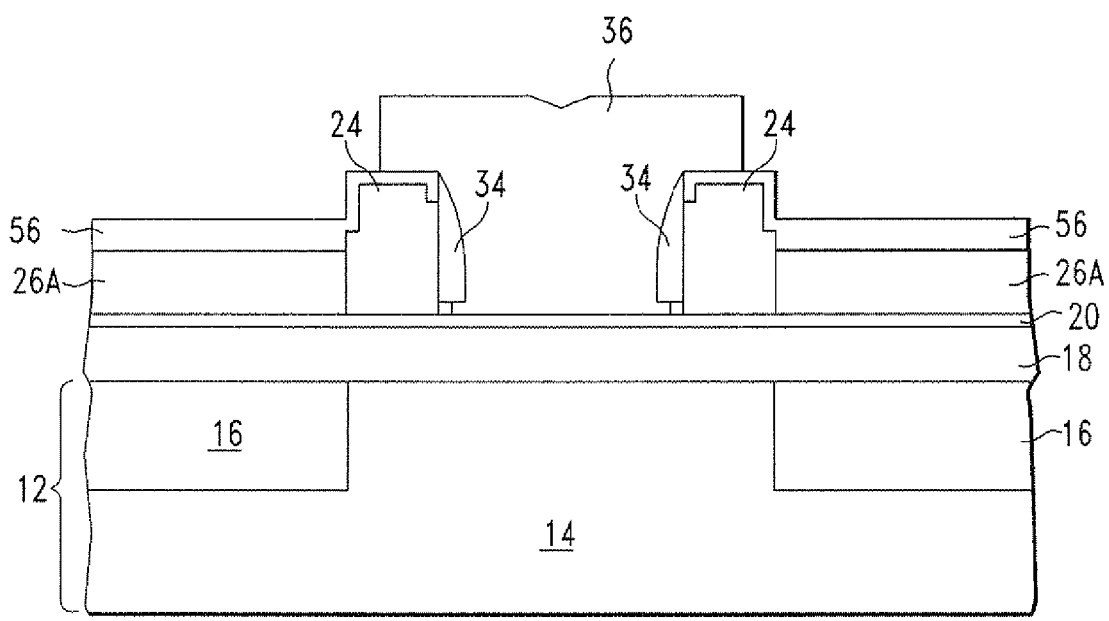

Next, and as shown in FIG. 2F, nitride pedestal 54 is removed from the structure providing emitter opening 30 that exposes oxide base layer 52. The nitride pedestal 54 is removed utilizing an etching process, wet or dry, the selectively removes nitride as compared to oxide. Preferably, a wet etch process that includes a chemical etchant such as hot phosphoric acid is used in removing the nitride pedestal 54.

Nitride spacers 34 are then formed inside the emitter opening 30 on the exposed sidewall surfaces of oxide 56 and monocrystalline material 24. The nitride spacers 34 are formed by the same technique as described above in regard to the first embodiment of the present invention. The resultant structure is shown, for example, in FIG. 2G.

After forming the nitride spacers 34 within the emitter opening 30, a COR process such as that described above is used in removing oxide base layer 52 from the structure so as to expose either the optional Si-containing cap layer 20 or the underlying base layer 18, if the cap is not present. The COR process provides the structure shown in FIG. 2H.

PolySi emitter 36 is then formed as described above in the emitter opening 30 providing the structure shown in FIG. 2I. As is the case in the first embodiment of the present invention, the HBT shown in FIG. 2I can either by a NPN or a PNP HBT, with a NPN HBT being highly preferred. The structure shown in FIG. 2I is a self-aligned emitter (36)/raised extrinsic base (26B) bipolar structure.

It is noted that the above embodiments of the present invention provide a simple approach to integrate a self-aligned raised extrinsic base HBT into an advanced BiCMOS process. The HBTs of the present invention typically exhibit an fT value that is greater than 200 GHz.

It should be emphasized that the process described above applies equal well when region 26A is single crystal instead of polycrystalline as depicted and described above. Briefly, region 26A can be single crystal instead of polycrystalline when an oxygen implant and high temperature anneal are used to form an isolation region underneath the Si wafer surface that has the same function as the isolation region 16, i.e. shallow-trench-isolation (STI). The oxygen implant and high temperature anneal used in forming the single crystal region 26A is described in more detail in U.S. patent application Ser. No. 10/709,114 entitled BiCMOS TECHNOLOGY ON SIMOX WAFERS, the entire contents of which is incorporated by reference. Further, the structure could be formed by including no oxide isolation regions therein.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a heterobipolar transistor comprising:

forming a pedestal atop a structure that comprising at least a base layer located on a surface of a substrate having a collector and trench isolation regions located therein;

forming an extra base layer over said structure including said pedestal, wherein said extra base layer comprises monocrystalline material over the substrate and polycrystalline material over the pedestal and said base layer that is located atop said trench isolation regions, said polycrystalline material over said pedestal is thinner than the polycrystalline material over said base layer that is located atop said trench isolation regions;

converting at least said polycrystalline material over said pedestal of said extra base layer into an oxide utilizing a low temperature process that is performed at a temperature of about 700° C. or less;

removing said oxide and said pedestal from said structure to provide an emitter opening; and forming at least a polysilicon emitter in said emitter opening.

2. The method of claim 1 wherein said pedestal is an oxide pedestal that is formed by deposition, lithography and etching.

3. The method of claim 2 wherein said removing of said oxide formed by said converting step and said oxide pedestal are performed using a single etching step and some polycrystalline material of said extra base layer remains.

4. The method of claim 3 further comprising forming an oxide layer in at least said emitter opening after said removal step.

5. The method of claim 4 wherein said oxide layer is formed by a low temperature oxidation process that is performed at a temperature of about 700° C. or less.

6. The method of claim 5 wherein said low temperature oxidation is a high-pressure oxidation process that is performed at a pressure of about 1 atmosphere or greater than about 1 atmosphere.

7. The method of claim 4 further comprising forming a nitride spacer on each exposed sidewall within said emitter opening.

8. The method of claim 7 further comprising performing a chemical oxide removal process to remove said oxide layer from a bottom surface of said emitter opening thereby exposing the base layer.

9. The method of claim 8 wherein said chemical oxide removal process is a vapor or a plasma of HF and $NH_3$.

10. The method of claim 1 wherein said base layer is formed by an epitaxy growth process that is performed at a temperature from about 450° C. to about 700° C.

11. The method of claim 1 wherein said base layer comprises Si, SiGe or a combination of Si and SiGe.

12. The method of claim 1 wherein said structure further comprises an optional Si-containing cap layer located atop said base layer.

13. The method of claim 1 wherein said forming said extra base layer comprising an epitaxy growth process that is performed at a temperature from about 450° C. to about 700° C.

14. The method of claim 1 wherein said extra base layer comprises Si, SiGe or a combination of Si and SiGe.

15. The method of claim 1 wherein said low temperature oxidation process comprises a high-pressure oxidation process that is performed at a pressure of about 1 atmosphere or greater.

16. The method of claim 1 wherein said removing step comprises an etching process that selectively removes oxide.

17. The method of claim 1 wherein said forming at least said polysilicon emitter comprising depositing a doped or undoped polysilicon layer, optionally implanting dopants into said undoped polysilicon layer, lithography and etching.

18. A method of forming a heterobipolar transistor comprising the steps of:

forming an oxide pedestal atop a structure that comprises at least a base layer located on a surface of a substrate having a collector and trench isolation regions located therein;

forming an extra base layer over said structure including said oxide pedestal, wherein said extra base layer comprises monocrystalline material over the substrate and polycrystalline material over the oxide pedestal and said base layer that is located above said trench isolation regions, said polycrystalline material over said oxide pedestal is thinner than the polycrystalline material over said base layer that is located above said trench isolation regions;

converting at least said polycrystalline material over said oxide pedestal of said extra base layer into an oxide utilizing a low temperature oxidation process at a temperature of about 700° C. or less;

removing said oxide and said oxide pedestal from said structure using a single etching process to provide an emitter opening;

forming an oxide layer on exposed surfaces using a second low temperature oxidation process;

forming a nitride spacer within said opening;

removing said oxide layer from a bottom surface of said emitter opening exposing said base layer; and forming at least a polysilicon emitter in said emitter opening.

* * * * *